(12) United States Patent
Chao

(10) Patent No.: US 8,756,354 B2
(45) Date of Patent: Jun. 17, 2014

(54) KEYBOARD SUPPORTING N-KEY ROLLOVER

(75) Inventor: Shih Chuan Chao, New Taipei (TW)

(73) Assignee: Duckychannel International Co., Ltd., Taipei (TW)

( * ) Notice: Subject to any disclaimer, the term of this patent is extended or adjusted under 35 U.S.C. 154(b) by 0 days.

(21) Appl. No.: 13/605,937

(22) Filed: Sep. 6, 2012

(65) Prior Publication Data
US 2013/0060976 A1    Mar. 7, 2013

(30) Foreign Application Priority Data
Sep. 7, 2011  (TW) .............................. 100216728 U

(51) Int. Cl.
*G06F 13/14* (2006.01)
(52) U.S. Cl.
USPC .............................................. 710/67; 710/38
(58) Field of Classification Search
None
See application file for complete search history.

(56) References Cited

U.S. PATENT DOCUMENTS

| | | | | |
|---|---|---|---|---|
| 6,714,143 B2* | 3/2004 | Ideura | ............................ | 341/23 |
| 6,725,318 B1* | 4/2004 | Sherman et al. | ............. | 710/313 |
| 6,909,423 B2* | 6/2005 | Wu et al. | ....................... | 345/168 |
| 7,878,833 B2* | 2/2011 | Chen et al. | .................... | 439/284 |
| 8,159,372 B2* | 4/2012 | Sherman | ......................... | 341/24 |
| 8,217,809 B2* | 7/2012 | Westhues et al. | .............. | 341/22 |
| 8,260,988 B2* | 9/2012 | Cao et al. | ....................... | 710/67 |
| 8,274,408 B2* | 9/2012 | Liang | ............................. | 341/22 |
| 2004/0067737 A1* | 4/2004 | Kuo | ............................. | 455/90.3 |
| 2004/0185719 A1* | 9/2004 | Wang | ............................ | 439/638 |
| 2006/0227112 A1* | 10/2006 | Hsieh et al. | ................... | 345/168 |
| 2008/0294887 A1* | 11/2008 | Wang | ............................... | 713/2 |

OTHER PUBLICATIONS

HID Spec, Universal Serial BUS (USB) Device Class Definition for Human Interface Devices (HID), USB Implementer's Forum, 2001, pp. 1-97.*
USB, Universal Serial Bus Specification, Apr. 2000, http://www.usb.org, pp. 1-3.*

* cited by examiner

*Primary Examiner* — Cheng-Yuan Tseng

(57) ABSTRACT

A keyboard supporting N-key rollover (NKRO) is provided. The keyboard includes a first key data output module, which is coupled to a keyboard matrix for outputting an unlimited number of key data to a particular OS via a universal serial bus (USB) interface, and a second key data output module, which is coupled to the keyboard matrix for outputting a particular number of key data to any type of OS via the USB interface, synchronously.

8 Claims, 2 Drawing Sheets

KEYBOARD SUPPORTING N-KEY ROLLOVER

CROSS REFERENCE TO RELATED APPLICATIONS

This Non-provisional application claims priority under 35 U.S.C. §119(a) on Patent Application No(s). 100216728, filed in Taiwan, Republic of China on Sep. 7, 2011, the entire contents of which are hereby incorporated by reference.

BACKGROUND OF THE INVENTION

1. Field of the Invention

The present invention relates to keyboards which supports N-key rollover technology.

2. Description of the Related Art

A ghost key (phantom key) is a phenomenon which commonly occurs with traditional keyboards, wherein some data is not inputted, even after the pressing of several keys.

Keys on a keyboard with ghost key phenomenon are usually arranged in a keyboard matrix. By looking up a keyboard code table based on the column data and row data of the keyboard matrix, the keyboard controller can locate the keys pressed by a user and output data. There are usually 16 column lines and 8 row lines on a printed circuit board of a mechanical keyboard. The column lines and the row lines intersect into 128 points, and each of the points represents a key (most keyboards have a total of 103 keys). Therefore, when a user presses a key, the keyboard controller scans the keyboard matrix and locates the pressed key. FIGS. 1A-1D show a simplified 2×2 keyboard matrix (having four intersected points for representing four keys "Q", "W", "A" and "S", respectively) for illustrating how the keyboard controller determines the column and row data of a key.

In FIG. 1A, since the columns C1 and C2 and the rows R1 and R2 are not conducting, it can be determined that all of the four keys are not being pressed. In FIG. 1B, the user only presses the key "Q". Since when scanning the column C1, the row R1 is conducting and the row R2 is not conducting, it can be determined that the intersected point of the column C1 and the row R1 (i.e., key "Q") is being pressed but the intersected point of the column C1 and the row R2 (i.e., key "A") is not being pressed. Since when scanning the column C2, the row R1 and the row R2 are both not conducting, it can be determined that the intersected points of the column C1 and the rows R1 and R2 (i.e., keys "W" and "S") are not being pressed. Similarly, the keyboard controller in FIG. 1C can easily determine that two keys "Q" and "S are being pressed by the user. In FIG. 1D, although the user only presses three keys "Q", "W" and "A", since when scanning columns C1 and C2 it can be determined that both rows R1 and R2 are conducting, the keyboard controller may wrongly determine that there are four keys being pressed at the same time (including the key "S" which is not being pressed), thus producing "the ghost key". In order to prevent this phenomenon, the keyboard controller usually neglects the third pressed key and only outputs the first and the second pressed key. This is the so called "two-key rollover" manner.

It is not ideal for a keyboard to only support two-key rollover, because it may cause problems with word processing and game playing. Therefore, the prior art also uses N-key rollover (NKRO) technology to overcome the mentioned defects. Many keyboard manufacturers assert that their keyboards support NKRO, but they actually don't; especially for keyboards with the USB interface (this type of keyboard can merely output any six keys excluding auxiliary keys such as "Shift", "Ctrl" and "Alt"). Some keyboards with USB interfaces can support NKRO, but only for particular operating systems (OS).

BRIEF SUMMARY OF THE INVENTION

The present invention provides a keyboard supporting N-key rollover (NKRO). The keyboard comprises a first key data output module, which is coupled to a keyboard matrix for outputting an unlimited number of key data to a particular OS via a universal serial bus (USB) interface, and a second key data output module, which is coupled to the keyboard matrix for outputting a particular number of key data to any type of OS via the USB interface, synchronously.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Keyboards in the prior art usually connect to interfaces via a PS/2 bus or universal serial bus (USB). For the prior art keyboard which connects to the PS/2, diodes are used and added to each intersection of the keyboard matrix to prevent the ghost key phenomenon and support N-key rollover (NKRO).

Note that the USB-interfaced keyboard and the PS/2-interfaced keyboard output key data in different ways. According to Human interface device (HID) specification, the length of each packet outputted by the USB keyboard during each key press is limited to 8 bytes, and 2 bytes thereof are used as modifier keys or reserved keys (for example, the modifier keys include auxiliary keys such as "Shift", "Ctrl", "Alt", "Windows", etc., and the reserved keys include auxiliary keys such as "Caps Lock", "Number Lock", "Scroll Lock", etc.). Due to this limitation, the keyboard can only output 6 non-auxiliary keys at each time, not an unlimited number of keys.

Figure 1B:
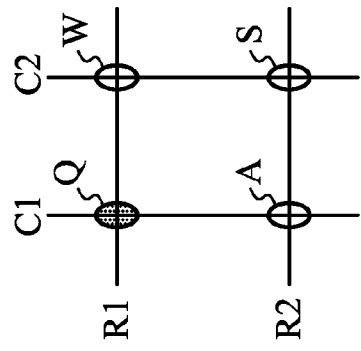
FIGS. 1A-1D shows a simplified 2×2 keyboard matrix.
Figure 1D:
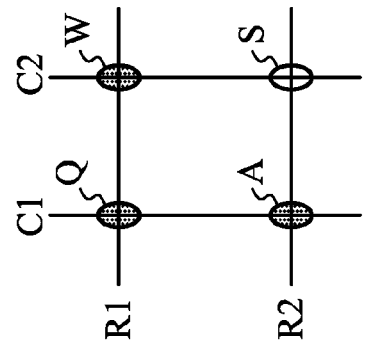
Figure 1A:
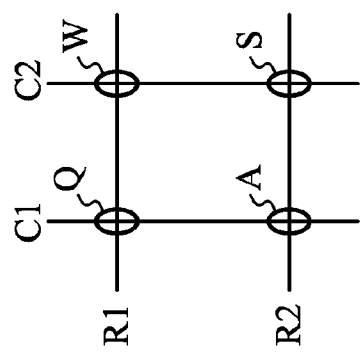
Figure 1C:
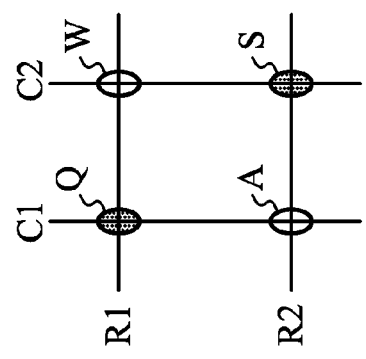
Figure 2:
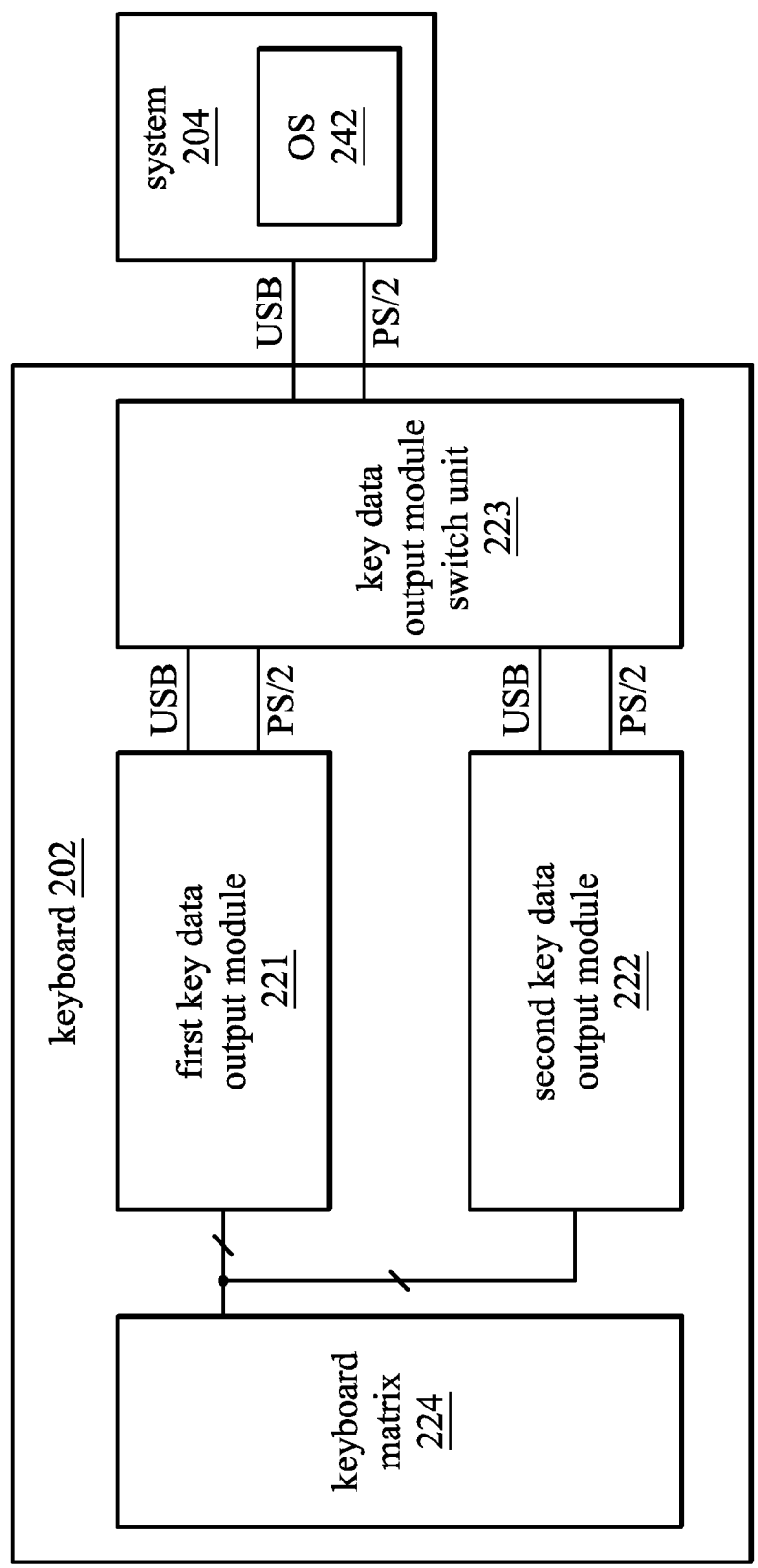
FIG. 2 is a schematic diagram of the keyboard according to an embodiment of the present invention.

To overcome the limitation described above, the present invention provides a NKRO keyboard which can output an unlimited number of key data for various operating systems via the USB interface. FIG. 2 is a schematic diagram of the keyboard according to an embodiment of the present invention. In this embodiment, the keyboard 202 is coupled to a system 204, and the system 204, for example, is a personal computer installed with an operating system (OS) 242. The keyboard 202 of the present invention comprises a keyboard matrix 224, a first key data output module 221, a second key data output module 222, and a key data output module switch unit 223. The structure and function of these components will be described in detail in the following paragraphs.

The first and the second key data output module 221 and 222 are both coupled to the keyboard matrix 224 and used to receive data of the keys pressed by a user from the keyboard matrix 224. In a better embodiment, each of the first and the second key data output module 221 and 222 has a PS/2 interface and a USB interface so that the keyboard 202 can output an unlimited number of key data for any type of OS by using the PS/2 interfaces (fully support NKRO). However, since the main purpose of the present invention is to improve the USB-interfaced keyboard, the PS/2 interface will not be further discussed. The present invention should not be limited to the embodiment of FIG. 2, and those skilled in the art can optionally omit the PS/2 interface and/or add other types of interfaces according to the spirit of the present invention.

The USB interface of the first key data output module 221 can actually support NKRO, and is not limited by the 8-bytes key data length rule of the HID specification. In an embodiment, a single keyboard of the present invention can simulate multiple keyboards. The first key data output module 221 can make the system 204 believe that it has connected to multiple keyboards, so that the simulated multiple keyboards can respectively output key data at the same time. To output more key data, the packets from the simulated multiple keyboards can be integrated into a new packet and the key data length can be further extended by omitting repeated modifier keys and reserved keys. However, it should be noted that unfortunately the manner described above can not works for some specific OS due to its nature. Therefore, the first key data output module 221 can be merely used to output an unlimited number of key data to a "particular" OS. Specifically, the simulated multiple keyboards can not work for LINUX and MAC OS, thus the "particular OS" in the present invention can be any operating systems (for example, WINDOWS) other than the LINUX and MAC OS. In conclusion, the first key data output module 221 of the present invention can actually support NKRO and output an unlimited number of key data to a particular OS such as Window OS, which is a non-LINUX- or-MAC OS. In other words, the first key data output module 221 may fail to output key data to LINUX OS or MAC OS because these types of OS can not successfully identify the integrated packet outputted by the simulated multiple keyboards.

The present invention provide the second key data output module 222 to output key data for the LINUX) or MAC OS. Based on the HID specification described above, the USB interface of the second key data output module 222 can only output an 8-bytes packet during a press, thus the second key data output module 222 is compatible to any type of OS (such as, LINUX, MAC OS, and WINDOWS) and can be used to output particular (limited) number of key data to any type of OS. As described above, the particular number of key data means any six key data other than the auxiliary key data such as Ctrl, Alt, etc.

Although the second key data output module 222 also can be used for WINDOWS OS, we prefer to use the first key data output module 222 to output more key data. Therefore, the present invention provides the key data output module switch unit 223 to switch between the first key data output module 221 and the second key data output module 222, so that the user can choose the most suitable way to output key data in the light of the OS 242 of the system 204. For example, when the keyboard 202 is coupled to the system 204 via the USB interface and the OS 242 is the WINDOWS OS, the key data output module switch unit 223 can switch to the first key data output module 221 to output an unlimited number of key data to the system 204. And, when the keyboard 202 is coupled to the system 204 via the USB interface and the OS 242 is the LINUX or MAC OS, the key data output module switch unit 223 can switch to the second key data output module 221 to output particular (limited) number of key data (any six non-auxiliary key) to system 204 and make sure the keyboard 202 can normally work under OS 242.

It should be noted the key data output module switch unit 223 of the present invention can be various mechanical switch devices, electrical switch devices, or a combination thereof. In addition, the key data output module switch unit 223 can switch between modules 221 and 222 by the user manually or by an OS detection unit (not shown) in the keyboard 204 automatically. For example, the OS detection unit can detect whether the OS 242 connected to the keyboard 204 is the "particular OS" described above (i.e., WINDOWS, in this invention). When the OS detection unit detects the particular OS (i.e., WINDOWS), the key data output module switch unit 223 automatically switches to the first key data output module 221 and supports the NKRO. And, when the OS detection unit detects another OS (for example, LINUX or MAC OS), the key data output module switch unit 223 automatically switches to the second key data output module 222 to make sure the compatibility of the keyboard 202 is met.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A keyboard supporting N-key rollover (NKRO), comprising:
   a first key data output module, disposed in the keyboard, coupled to a keyboard matrix, configured to output any number of key data to a particular operating system (OS) via a universal serial bus (USB) interface;
   a second key data output module, disposed in the keyboard, coupled to the keyboard matrix, configured to output a particular number of key data to any type of OS via the USB interface; and
   a key data output module switch unit, configured to switch between the first key data output module and the second key data output module.

2. The keyboard as claimed in claim 1, wherein the key data output module switch unit is a mechanical switch device.

3. The keyboard as claimed in claim 1, wherein the key data output module switch unit is an electrical switch device.

4. The keyboard as claimed in claim 1, wherein the key data output module switch unit is a manual switch device.

5. The keyboard as claimed in claim 1, wherein the particular OS is WINDOWS OS.

6. The keyboard as claimed in claim 1, wherein the particular number of key data is data from any six keys.

7. The keyboard as claimed in claim 1, wherein the first key data output module is configured to output any number of key data to any type of OS via a PS/2 interface.

8. The keyboard as claimed in claim 1, wherein the second key data output module is configured to output any number of key data to any type of OS via a PS/2 interface.

* * * * *